(12) United States Patent
Hu et al.

(10) Patent No.: US 9,099,273 B2
(45) Date of Patent: Aug. 4, 2015

(54) METHOD FOR MANUFACTURING NANOSTRUCTURES AND CATHODE FOR FIELD EMISSION LIGHTING ARRANGEMENT

(71) Applicant: LIGHTLAB SWEDEN AB, Stockholm (SE)

(72) Inventors: Qiu-Hong Hu, Göteborg (SE); Shang-Ray Yang, Taipei (TW); Kjell Bohlin, Uppsala (SE)

(73) Assignee: Lightlab Sweden AB, Stockholm (SE)

( * ) Notice: Subject to any disclaimer, the term of this patent is extended or adjusted under 35 U.S.C. 154(b) by 19 days.

(21) Appl. No.: 14/345,439

(22) PCT Filed: Oct. 5, 2012

(86) PCT No.: PCT/EP2012/069787
§ 371 (c)(1),
(2) Date: Mar. 18, 2014

(87) PCT Pub. No.: WO2013/050570
PCT Pub. Date: Apr. 11, 2013

(65) Prior Publication Data
US 2014/0346976 A1 Nov. 27, 2014

(30) Foreign Application Priority Data
Oct. 5, 2011 (EP) .................................. 11183984

(51) Int. Cl.
*H01L 21/00* (2006.01)
*H01J 1/304* (2006.01)
(Continued)

(52) U.S. Cl.
CPC . *H01J 1/304* (2013.01); *C30B 7/10* (2013.01); *H01J 1/3044* (2013.01); *H01J 1/36* (2013.01);
(Continued)

(58) Field of Classification Search
CPC .............................. H01J 1/3044; H01J 1/308
USPC ............. 438/22; 257/10, 20, 41, 43; 977/840, 977/890, 892, 894
See application file for complete search history.

(56) References Cited

U.S. PATENT DOCUMENTS 6,401,526 B1 6/2002 Dai et al.
7,572,300 B2 * 8/2009 Cohen et al. ................... 850/58
(Continued)

OTHER PUBLICATIONS

Kazuhiko Takagahara et al, "Batch fabrication of carbon nanotubes on tips of silicon pyramid array", Micro Electro Mechanical Systems, 2007. MEMS IEEE 20th International Conference ON, IEEE, PI, Jan. 1, 2007.
(Continued)

*Primary Examiner* — Kimberly Rizkallah
*Assistant Examiner* — Maria Ligai
(74) *Attorney, Agent, or Firm* — Babock IP, PLLC (57) ABSTRACT

The present invention relates to a method for manufacturing a plurality of nanostructures comprising the steps of providing a plurality of protruding base structures (104) arranged on a surface of a first substrate (102), providing a seed layer mixture, comprising a solvent/dispersant and a seed material, in contact with the protruding base structures, providing a second substrate arranged in parallel with the first substrate adjacent to the protruding base structures, thereby enclosing a majority of the seed layer mixture between the first and second substrates, evaporating the solvent, thereby forming a seed layer (110) comprising the seed material on the protruding base structures, removing the second substrate, providing a growth mixture, comprising a growth agent, in contact with the seed layer, and controlling the temperature of the growth mixture so that nanostructures (114) are formed on the seed layer via chemical reaction in presence of the growth agent.

15 Claims, 5 Drawing Sheets

(51) Int. Cl.
*H01J 9/02* (2006.01)
*H01J 63/04* (2006.01)
*C30B 7/10* (2006.01)
*H01J 1/36* (2006.01)
*H01J 63/02* (2006.01)
*C30B 29/16* (2006.01)

(52) U.S. Cl.
CPC .................. *H01J 9/025* (2013.01); *H01J 63/02* (2013.01); *H01J 63/04* (2013.01); *C30B 29/16* (2013.01); *H01J 2201/30496* (2013.01)

(56) References Cited

U.S. PATENT DOCUMENTS

| | | |
|---|---|---|
| 2002/0159918 A1 | 10/2002 | Tseng |
| 2003/0213428 A1 | 11/2003 | Lu et al. |
| 2005/0009224 A1 | 1/2005 | Yang |
| 2007/0202673 A1* | 8/2007 | Kim et al. ................... 438/580 |
| 2007/0284573 A1* | 12/2007 | Tseng et al. .................. 257/43 |
| 2008/0038538 A1* | 2/2008 | Ruby ........................... 428/323 |
| 2009/0068411 A1 | 3/2009 | Hong et al. |
| 2011/0012505 A1* | 1/2011 | Lin et al. ..................... 313/504 |

OTHER PUBLICATIONS

Sato Hideki et al, "Selective growth of carbon nanotubes on silicon protrusions", Journal of Vacuum Science and Technology, Part B, AVS/AIP, Melville, New York, New York, US, vol. 23, No. 2, Apr. 7, 2005.

Wange Sigen et al, "A carbon nanotube field emission multipixel x-ray array source for microradiotherapy application", Applied Physics Letters, AIP, American Institue of Physics, Melville, NY, US, vol. 98, No. 21, May 25, 2011.

S. Schmidt-Karst, International Search Report for PCT Application PCT/EP2012/069787, May 11, 2012, European Patent Office, Rijswijk, NL.

* cited by examiner

METHOD FOR MANUFACTURING NANOSTRUCTURES AND CATHODE FOR FIELD EMISSION LIGHTING ARRANGEMENT

FIELD OF THE INVENTION

The present invention relates to a method for fabricating nanostructures on a substrate. The present invention also relates to a cathode, to be used in a field emission arrangement, comprising nanostructures.

TECHNICAL BACKGROUND

Traditional incandescent light bulbs are currently being replaced by other light sources having higher energy efficiency and less environmental impact. Alternative light sources include light emitting diode (LED) devices and fluorescent light sources. However, LED devices are expensive and complicated to fabricate and fluorescent light sources are known to contain small amounts of mercury, thereby posing potential health problems due to the health risks involved in mercury exposure. Furthermore, as a result of the mercury content, recycling of fluorescent light sources is both complicated and costly.

An attractive alternative light source has emerged in the form of field emission light sources. A field emission light source includes an anode structure and a cathode structure, the anode structure consists of a transparent electrically conductive layer and a layer of phosphor coated on the inner surface of e.g. a transparent glass tube. The phosphor layer emits light when excited by the electrons emitted from the cathode structure.

Furthermore, it is known that nanostructures are suitable for use as the field emitters in a cathode structure. Several methods for fabricating nanostructures are known. As an example, Yang et al., Chin. Phys. Lett. Vol. 26, No. 3 (2009) 038101 discloses a method for fabricating ZnO nanoneedles for use as field emitters. However, the method disclosed by Yang et al. includes several process steps not suitable for large scale fabrication of field emission devices such as the high temperature growth step and the random distribution of nanostructures.

Accordingly there is a need for an improved method for fabrication of nanostructures for use as field emitters.

SUMMARY OF THE INVENTION

In view of the above-mentioned and other drawbacks of the prior art, a general object of the present invention is to provide an improved method for fabricating nanostructures suitable for use as field emitters.

According to a first aspect of the present invention, it is provided a method for manufacturing a plurality of nanostructures comprising the steps of providing a plurality of protruding base structures arranged on a surface of a first substrate, providing a seed layer mixture, comprising a solvent or dispersant and a seed material, in contact with the protruding base structures, providing a second substrate arranged in parallel with the first substrate adjacent to the protruding base structures, thereby enclosing a majority of the seed layer mixture between the first and second substrates, evaporating the solvent/dispersant, thereby forming a seed layer comprising the seed material on the protruding base structures, removing the second substrate, providing a growth mixture, comprising a growth agent, in contact with the seed layer, and controlling the temperature of the growth mixture so that nanostructures comprising the growth agent are formed on the seed layer.

The present invention is based on the realization that providing a second substrate in parallel with the first substrate and adjacent to the protruding base structures enables control of the thickness and distribution of the seed layer mixture. In particular, the distribution of the seed layer can be controlled so that seed particles mainly are attached to the upper portion of the protruding base structures. Thereby, as nanostructures predominantly develop from existing seeds, the grown nanostructures tend to appear in the vicinity of the upper portion of the protruding base structures rather than at the bottom of the protruding base structures. Such a site-selective distribution of nanostructures provides an enhanced field emission performance when the nanostructures are used as field emitters.

Furthermore, within the present context the expression growth agent is understood to comprise a source material for the growth of the nanostructures. The growth agent may comprise a single "pure" material or a mixture of a plurality of different materials, such as a molecule or a compound. The chemical reaction resulting in formation/growth of nanostructures takes place in presence of the growth agent dissolved in the growth mixture through chemical reaction with said growth agent.

By tuning the mixing ratio of the seed material and solvent, the flowability of the seed layer mixture may be changed, which in turn modifies the amount of nucleation sites on the seed layer and the distribution density of as-grown nanostructures. Furthermore, the step of forming the seed layer according to the present invention offers additional advantages over conventional deposition techniques known in the art. For example, prior art methods of sputtering of a continuous seed layer may lead to degradation or alteration of the shape of the protruding base structures. Furthermore, prior art spin coating which is commonly used on flat substrates is not suitable on a substrate comprising protruding structures, such as the aforementioned base structures, as spin coating on an uneven surface may lead to a non-homogeneous distribution of the spin coated material. Due to gravity, the spin coated material may tend to accumulate on interspaces or grooves between the protruding base structures, rather than on a tip of the protruding base structures. As a result, nanostructures are more likely to grow on sites located at interspaces between protruding base structure, so that the protruding base structure may not be made of full use due to lack of nanostructures grown thereon.

Furthermore, an additional advantage is related to the protruding base structures when a cathode structure for field emission is fabricated according to the method of the invention. A protruding base structure is advantageous regarding the voltage that needs to be applied over the cathode in order to achieve field emission from the nanostructure arranged on the base structure. For a flat surface, a higher voltage is required to achieve field emission in contrast to the presented structure where the voltage is concentrated to the protruding base structures thereby resulting in a higher electric field at the position of the nanostructures acting as field emitters.

The protruding base structures may preferably be shaped as square pyramids. Such pyramid shaped base structures can for example be formed by anisotropically etching of a Si surface in aqueous KOH solution. Other types of protruding base structures, such as cylinders, square protrusions or the like, are of course possible and within the scope of the invention.

Furthermore, the nanostructures may advantageously be nanorods. The term nanowire generally describes a long nanostructure with a round-like cross section, while a nanorod generally has a hexagonal cross section. However, the nanostructures may also be other structures suitable for use as field emitters such as carbon nanotubes.

In a preferred embodiment, there is provided one single thin, well-aligned (pointing outwards from the top of the pyramid) nanorod/structure located at the tip of the pyramid. Alternatively, there may be provided a bundle of a few nanorods/structures on each of the pyramids, where each of the nanorods/structures should have a tip as sharp as possible, advantageously having essentially the same sharpness and length, and achieving a local distribution density of less than $5 \times 10^7$ cm$^{-2}$ is preferred. The substrate may typically be a conventional silicon substrate, however, other substrate materials may equally well be used. Furthermore, the solvent component in the seed layer mixture may be evaporated through air exposure at room temperature or at elevated temperatures in a heat treatment process. The solvent or dispersant should in the present context be understood as any fluid capable of realizing a homogeneous dispersion of the seed material in the seed layer mixture.

In the present context, the term nanostructure refers to a structure where at least one dimension is on the order of up to a few hundreds of nanometers. Such nanostructures may for example include nanorods, nanowires, nanopencils, nanospikes, nanoflowers, nanobelts, nanoneedles, nanodisks, nanowalls, nanofibres and nanospheres. Furthermore, the nanostructures may also be formed by bundles of any of the aforementioned structures. The preferred growth direction of the nanostructures is in a direction essentially perpendicular to the substrate.

In one embodiment of the invention, the nanostructure may advantageously be composed of ZnO. Using zinc nitrate hexahydrate as the growth agent in the growth mixture leads to growth of ZnO nanostructures in the growth step of the method. However, the nanostructure must not be formed by ZnO, other alternative materials comprising conductive or semiconductive oxides, borides, nitrides, carbides, metallic alloys or silicides may equally well be used to grow nanostructures using a method according to embodiments of the present invention.

According to one embodiment of the invention, the temperature of the growth mixture may be controlled to be between 60 and 100° C., preferably between 80 and 95° C. and most preferably between 88 and 92° C. It has been found by the inventors that it is advantageous to grow the nanostructures at the aforementioned temperature range as this provides morphologically reproducible nanostructures exhibiting improved emission properties.

Employing the low-temperature growth method described above is advantageous in that the process is easy and may be performed without complicated and expensive process equipment that is frequently required for high-temperature growth method such as thermal decomposition, thermal evaporation, physical vapor deposition (PVD) or chemical vapor deposition (CVD). Furthermore, a low temperature process offers greater flexibility in the choice of substrate material as temperature sensitive materials such as plastics may be used for example for manufacturing flexible displays.

According to one embodiment of the invention, the second substrate may advantageously comprise a plurality of protruding base structures corresponding to the protruding base structures of the first substrate.

Furthermore, the protruding base structures of the first and the second substrate may have the shape of square pyramids.

In one embodiment of the invention, the step of providing a second substrate arranged in parallel with said first substrate may further comprise arranging the second substrate such that the protruding base structures of the second substrate non-contactingly engage the protruding base structures of the first substrate. The arrangement of the second substrate such that the base structures of the two substrates interacts without being in contact enables subsequent selective growth of nanostructures on the upper portion of the protruding base structure of the first substrate. When the second substrate is brought closer to the first substrate as the solvent evaporates, the distance between the respective protruding base structures will be reduced. Thereby, it will be more difficult for agglomerated particles to diffuse downwards and they therefore tend to attach to the upper portions of the protruding base structure of the first substrate. Accordingly, site-selective growth of nanostructures from the nanoparticles attached to the protruding base structures is facilitated. Even though the present embodiment relates to protruding base structures shaped as pyramids, it should be noted that the described principle is equally valid for protruding base structures having conical, elongate cylindrical or cuboid geometries.

In one embodiment of the invention, the plurality of protruding base structures may be arranged in an array having a center-to-center distance of 10 μm to 100 μm, more preferably 10 μm to 60 μm, and most preferably 10 μm to 40 μm. Furthermore, the protruding base structures may be at least partly electrically conductive. For example, the protruding base structures may be comprised of or coated by a conductive material in order to provide an electrically conductive path to the as-grown nanostructures acting as field emitters. The conductive material may for example comprise a metal, such as for example Ti or Ni. Other metals, conductive oxides, etc, are of course possible and within the scope of the invention.

According to one embodiment of the invention, the seed material may comprise a plurality of ZnO particles having a median particle size (D50) in the range of 20 to 150 nm. Possibly, the ZnO particles are monodispersed particles in the seed layer mixture. As the solvent/dispersant of the seed layer mixture is being evaporated, the remaining ZnO particles left on the protruding base structures act as nucleation sites in the subsequent step where nanostructures are grown.

According to one embodiment of the invention, the growth mixture may comprise zinc nitrate hexahydrate and at least one amine and a capping agent. The amine may for example be hexamethylenetetramine (HMTA). A zinc nitrate hexahydrate may advantageously be used as the zinc source in the growth mixture for growth of ZnO nanostructures. The amine may be provided as a hydrolysable base. The capping agent is provided in order to reduce growth in the lateral direction of a ZnO nanorod. A high aspect ratio of the nanorod is desirable as it results in a higher electric field strength at the tip of the nanorod, thereby leading to improved field emission performance. Aspect ratio should in the present context be understood as the length to width ratio of the nanostructure where the length is defined in a direction away from the protruding base structure.

In a preferred embodiment of the invention, the step of providing a growth mixture in contact with the seed layer may advantageously comprise arranging the first substrate in the growth mixture so that the seed layer faces a downward direction. Placing the as-seeded substrate "upside down" in the growth mixture aims to prevent any agglomerated ZnO clusters from precipitating on the substrate surface and on the protruding base structures. Thereby, growth may take place uninterrupted by any agglomerated ZnO clusters present in the growth mixture, which favors formation of cluster-free ZnO nanostructures.

According to a second aspect of the present invention, it is provided a cathode configured to be used in a field emission lighting arrangement, the cathode comprising an array of protruding base structures arranged on a substrate, wherein the protruding base structures are arranged to have a center-to-center distance of 10 μm to 100 μm, more preferably 10 μm to 60 μm, and most preferably 10 μm to 40 μm and a height of 5 to 30 μm, and at least one nanostructure arranged on each of the protruding base structures.

According to one embodiment of the invention, the at least one nanostructure may advantageously be a ZnO nanorod. Alternatively, the at least one nanostructure may be a carbon nanotube.

In one embodiment of the invention, the protruding base structures may advantageously be square pyramids having a base size of 10 to 60 μm. The cathode is preferably comprised in a field emission lighting arrangement, further comprising an anode structure at least partly covered by a phosphor layer, the anode structure being configured to receive electrons emitted by the field emission cathode, an evacuated chamber in which the anode structure and field emission cathode is arranged, and a power supply connected to the anode and the field emission cathode configured to apply a voltage so that electrons are emitted from the cathode to the anode.

The voltage is preferably in the range of 2-12 kV. The voltage may for example be provided by a power supply comprised with the field emission arrangement, e.g. arranged together with (such as for example within a socket in the case the field emission arrangement is a field emission light source) with or in the vicinity of the field emission arrangement. The power supply is preferably connected to the field emission cathode and the anode structure and configured to provide a drive signal for powering the field emission lighting arrangement.

Further effects and features of this second aspect of the present invention are largely analogous to those described above in connection with the first aspect of the invention.

BRIEF DESCRIPTION OF THE DRAWINGS

These and other aspects of the present invention will now be described in more detail with reference to the appended drawings showing an example embodiment of the invention, wherein.

DETAILED DESCRIPTION OF PREFERRED EMBODIMENTS OF THE INVENTION

In the present detailed description, various embodiments of a method for fabricating nanostructures according to the present invention are mainly discussed with reference to ZnO nanostructures suitable for use as field emitters. It should be noted that this by no means limits the scope of the present invention which is equally applicable to nanostructures comprising other materials. Like reference characters refer to like elements throughout.

A method according to various embodiments of the present invention will now be described with reference to the flowchart shown in FIG. 2 outlining the general method steps for fabrication of nanostructures together with FIGS. 1a to 1f illustrating the nanostructure device in different stages of the manufacturing process.

Figure 1A:
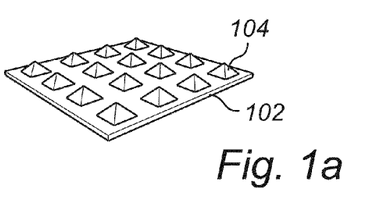
FIG. 1a-1f schematically illustrates the general steps of a method according to an embodiment of the invention.
Figure 2:
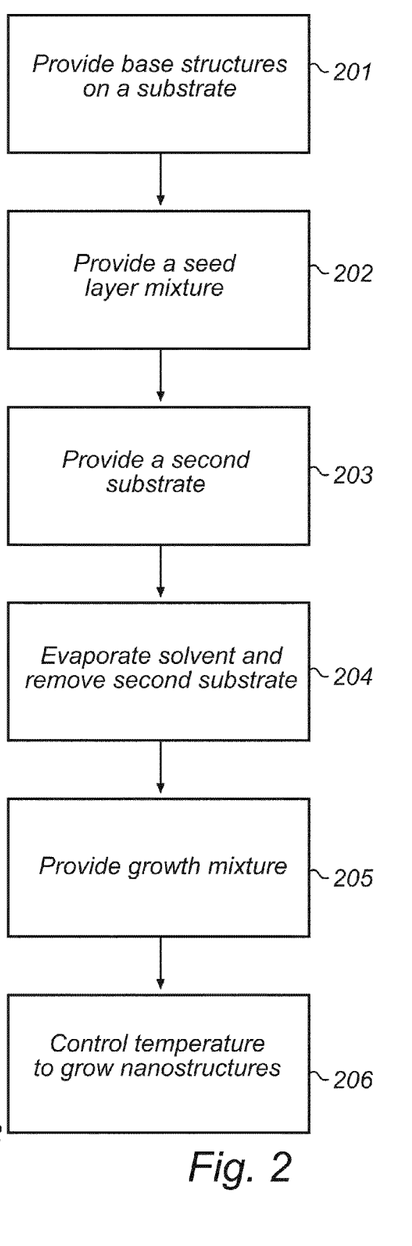
FIG. 2 is a flow chart outlining the general steps of a method according to an embodiment of the invention.

First, in step 201 illustrated in FIG. 1a, a preferred substrate 102 comprising pyramid shaped protruding base structures 104 is provided. The substrate can be of any insulating, semiconducting or conducting substrate, in this case a silicon wafer is selected. The protruding base structures 104 are formed by etching the silicon substrate in an aqueous KOH solution. As KOH anisotropically etches the silicon surface, pyramid depressions are formed by controlling the relevant parameters of the etching process such as etchant concentration, time and temperature. The depressions are subsequently filled with eg Ni, and "overfilled" to form a new metallic substrate and the remaining silicon is etched away. However, alternative ways of forming pyramid structures such as stamping or molding are equally possible.

In the present example, the length of the base of the pyramid 104 is approximately 25 μm, the height is approximately 20 μm and the center-to-center distance of the pyramid, i.e. the pitch, is 25 μm to 100 μm, more preferably 25 μm to 60 μm, and most preferably 25 μm to 40 μm.

Figure 1B:
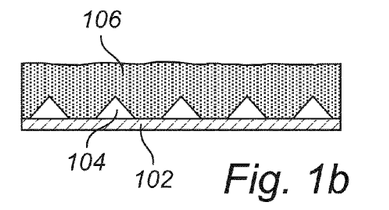

Next, in step 202 illustrated by FIG. 1b, the seed layer mixture 106 is applied on the substrate 102 covering the protruding base structures 104. The seed layer mixture 106 comprises ZnO in the form of ZnO particles. ZnO particles in the form of a powder are mixed with a volatile solvent, typically ethanol serves as a liquid medium to disperse the ZnO powders, thereby forming the seed layer mixture. The median particle size (D50) of the ZnO powders is typically 20-150 nm. However, the size of the ZnO particles may be varied depending on the desired properties of the seed layer, and possibly the ZnO particles are monodispersed particles in the seed layer mixture.

Figure 1C:
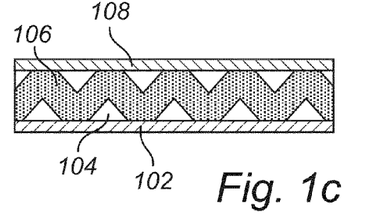
Figure 1D:
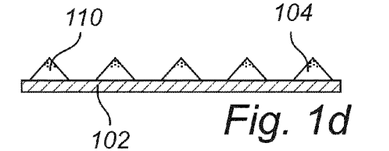

In the following step 203, illustrated by FIG. 1c, a second substrate 108 is arranged in parallel with the first substrate 102 in order to form a homogeneous distribution of the seed layer mixture 106 in the gap between the first and second substrates. Following the positioning of the second substrate 108, the solvent portion of the seed layer mixture is evaporated and the second substrate is removed according to step 204 and as illustrated in FIG. 1d. The evaporation may be achieved by simply waiting for a period of time, allowing the ethanol to evaporate. However, various heat treatments may also be feasible to increase the rate of evaporation or such heat treatments may be required if other less-volatile solvents are used. As the solvent is evaporated, ZnO particles 110 are deposited on the surface of the pyramid base structures 104 and predominantly on the surface of the upper portion of the structures 104. The ZnO particles 110 are intended to act as nucleation sites for the subsequent growth of nanostructures, thus forming the seed layer. After the ZnO particles are deposited, the seed layer is annealed at 300° C. for 1 h in an inert atmosphere in order to improve the adhesion of the seed layer. Furthermore, the annealing aims to modify the orientation of the seed layer in relation to the substrate surface. For example, if desirable in a specific embodiment, it may be possible to provide the seed layer such that the as-grown ZnO nanostructures are more likely to show an alignment perpendicular to the surface of the pyramids.

Figure 1E:
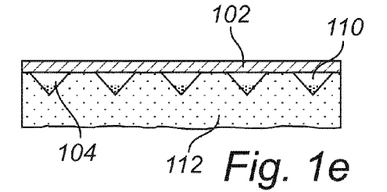

After deposition and annealing of the seed layer, the next step 205 is to provide the growth mixture 112 as illustrated in FIG. 1e, the growth mixture 112 comprises zinc nitrate hexahydrate acting as the growth agent, hexamethylenetetramine and a capping agent such as polyethyleneimine (PEI) or ethylenediamine.

The purpose of the capping agent is to control the growth of the ZnO nanostructures. In general, a ZnO nanorod exhibits a wurtzite hexagonal structure, in addition to the upper (0001) and lower (000$\bar{1}$) basal plane which has a normal perpendicular to the underlying substrate, there are six prismatic planes: ($\bar{1}$010), ($\bar{1}$100), (01$\bar{1}$0), (1$\bar{1}$00), (0$\bar{1}$10), and (10$\bar{1}$0). Taking one important morphological criterion, the aspect ratio of the rod, into consideration, a long rod with a smaller width, i.e. a high aspect ratio is preferred to improve field emission properties. One strategy to increase the aspect ratio is to limit growth on the prismatic planes by use of a capping agent. It has been indicated that the prismatic planes become electrochemically negative when the pH of the growth mixture is higher than the isoelectric point (IEP) of ZnO (8.7-9.5). The capping agent will keep the pH of the growth mixture above this range and electrostatically cap the negatively-charged prismatic planes, thus realizing the suppression of lateral growth.

As a result, a rod is less likely to grow in a lateral direction as the growth reaction takes place mainly on the (0001) plane along the c-axis of the nanorod. The length of the nanorod would then be increased without the drawback of an increased width. An increased aspect ratio which may improve the field emission performance is thereby expected.

Preferably, the substrate is arranged "upside down" in the growth mixture, with the pyramids facing a downward direction as illustrated in FIG. 1e, this in order to prevent any agglomerated ZnO clusters from precipitating on the substrate surface and on the protruding base structures.

Figure 1F:
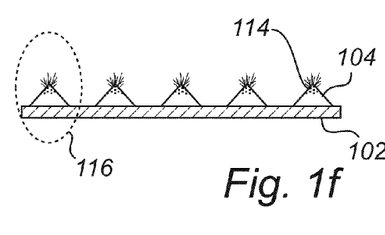

Finally, in step 206, the growth mixture is heated to a temperature of approximately between 88 and 92° C. to enable growth of ZnO structures and the resulting grown nanostructures 114 are schematically illustrated in FIG. 1f. The zinc nitrate hydrate in the growth mixture is the growth agent which serves as zinc source and forms ZnO nanostructures growing from nucleation sites of the seed layer. Preferably, the nanorods are grown in a direction perpendicular to the substrate. The resulting device 116 illustrated in FIG. 1f comprising at least one protruding base structure 104 with grown nanostructures 114 represents a cathode structure in a field emission lighting application.

Figure 3A:
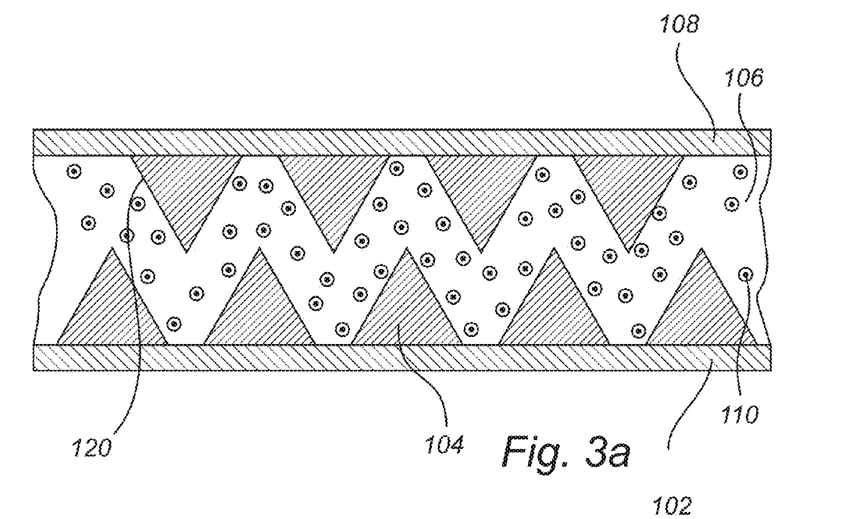
FIG. 3 outlines details of the manufacturing method according to an embodiment of the invention.

FIGS. 3a to 3d illustrate the growth steps 203 to 206 in more detail according to a particular embodiment of the invention. In FIG. 3a, the seed layer mixture 106 comprising ZnO particles has been applied on the substrate 102 covering the protruding base structures 104, and a second substrate 108 comprising protruding base structures 120 has been arranged on top of the first substrate such that the base structures 120 engage the bases structures 104 of the first substrate 102 without making direct contact.

Figure 3B:
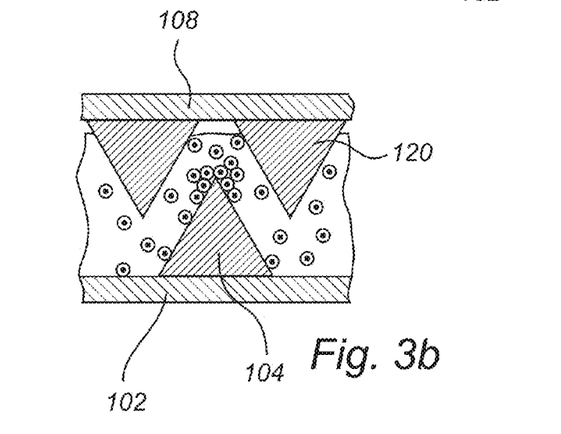

As the solvent of the seed layer mixture begins to evaporate as illustrated in FIG. 3b, the volume of solvent is reduced and the agglomeration of the particles increases. Also, as the solvent evaporates, the distance between the first and the second substrate is reduced due to gravity, thereby also the distance between the non-contactingly engaged protruding base structures is reduced.

With the reduced distance between the protruding base structures, it will be more difficult for the agglomerated particles to diffuse downwards due to steric hindrance. Instead, agglomerated particles will attach themselves to the top of the protruding base structure, thereby making it even more difficult for loose particles to diffuse downwards and as a result capturing even more of the loose particles. With reference FIGS. 3a-d illustrating pyramid structures, it should be noted that the described method is equally valid for structures having other geometries such as conical, elongate cylindrical or elongate cuboid structures.

Figure 3C:
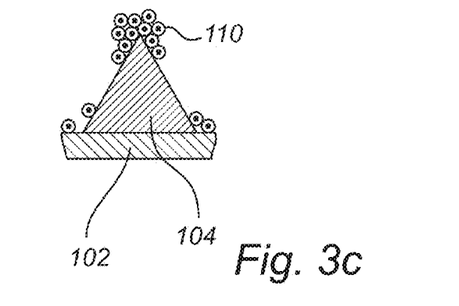
Figure 3D:
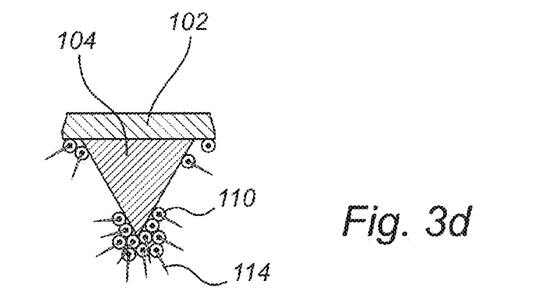

When all of the solvent is evaporated, the resulting distribution of particles will thus be approximately as shown in FIG. 3c. These particles will then serve as nucleation sites for subsequent hydrothermal growth of ZnO. When the first substrate 102 is then arranged upside down in the growth mixture, nanorods 114 will predominantly grow from the clusters of particles 110 attached to the peak of the base structure as illustrated in FIG. 3d.

An additional reason for the site-selective growth may be that during hydrothermal growth, nanostructures developing on the clusters of particles may also exhibit steric hindrance for diffusion of the growth agent. In FIG. 3c, nucleation sites located away from the peak of the protruding base structure are already rare, but they are less likely to result in growth of nanorods due to insufficient supply of growth agent.

Figure 4:
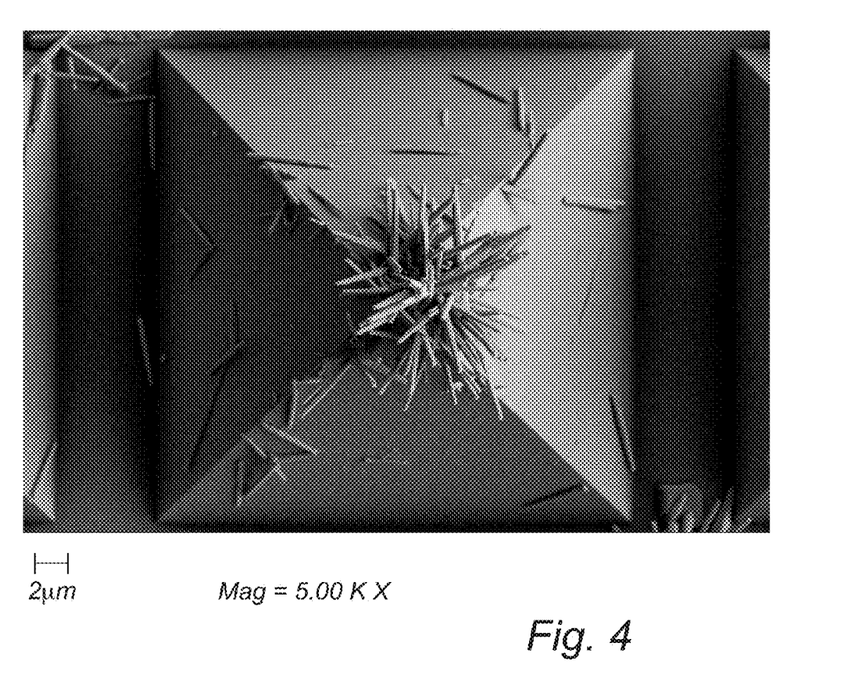
FIG. 4 is an SEM-image illustrating a device according to an embodiment of the invention.

An example of a resulting base structure after nanorod growth is illustrated in FIG. 4 where it can be seen that a majority of the grown nanorods appears near and around the peak of the base structure. It should be noted that site-selective growth of nanorods on the upper portions of the protruding base structures 104 of the first substrate 102 has been observed also for a second substrate 108 without protruding structures 120, although the site-selectivity appears to be stronger for a top substrate comprising protruding base structures 120.

Figure 5:
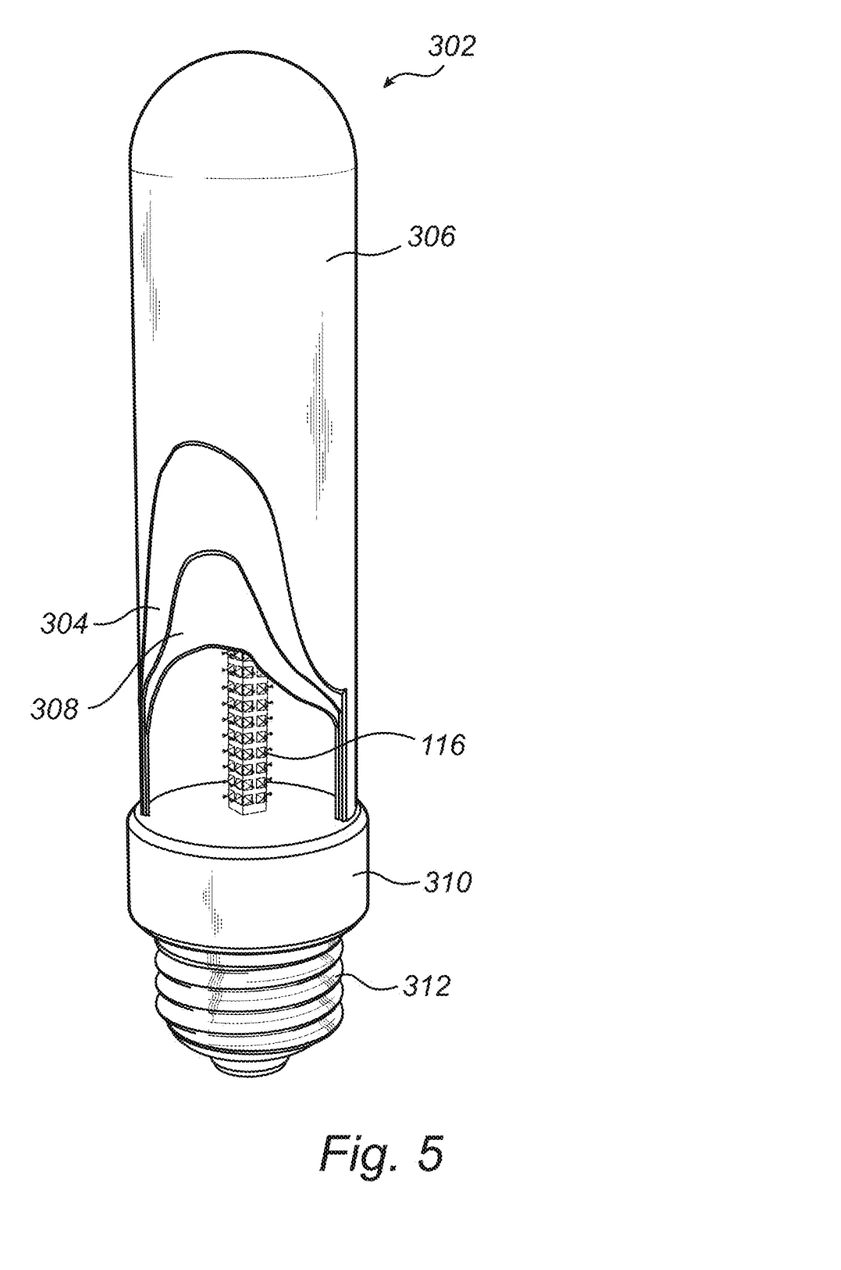
FIG. 5 schematically illustrates a device according to an embodiment of the invention.

Furthermore, FIGS. 5 and 6, illustrates two different conceptual field emission lighting applications according to currently preferred embodiments of the invention. First, the field emission lighting application 302 illustrated in FIG. 5 is based on the concept of using a transparent field emission anode, such as an indium tin oxide (ITO) layer 304 being provided on a transparent envelope, such as an evacuated cylindrical glass bulb 306. For emission of light, a layer of phosphor 308 is provided inside of the ITO layer 304, in the direction towards the above and in relation to FIG. 1f discussed field emission cathode 116. The field emission lighting arrangement 302 further comprises a base 310 and a socket 312, allowing for the field emission lighting arrangement 302 to be used for e.g. retrofitting conventional light bulbs. Within the concept of the invention, it is also possible to provide a similar tube based arrangement, having a similar form factor as e.g. T8, T5 fluorescent tubes, etc.

The base 310 preferably comprises a control unit for providing controlling a drive signals (i.e. high voltage) to the cathode 116. During operation of the field emission lighting application 302, an electrical field is applied between the cathode 116 and the anode layer, e.g. the ITO layer 304. By application of the electrical field, the cathode 116 emits electrons, which are accelerated towards the phosphor layer 308. The phosphor layer 308 may provide luminescence when the emitted electrons collide with phosphors within phosphor layer 308, thereby exciting electrons which when recombining emits photons. Light provided from the phosphor layer 308 will transmit through the transparent ITO/anode layer 304 and the glass cylinder 306. The light is preferably white, but colored light is of course possible and within the scope of the invention. The light may also be UV light.

Figures 6A, 6B:
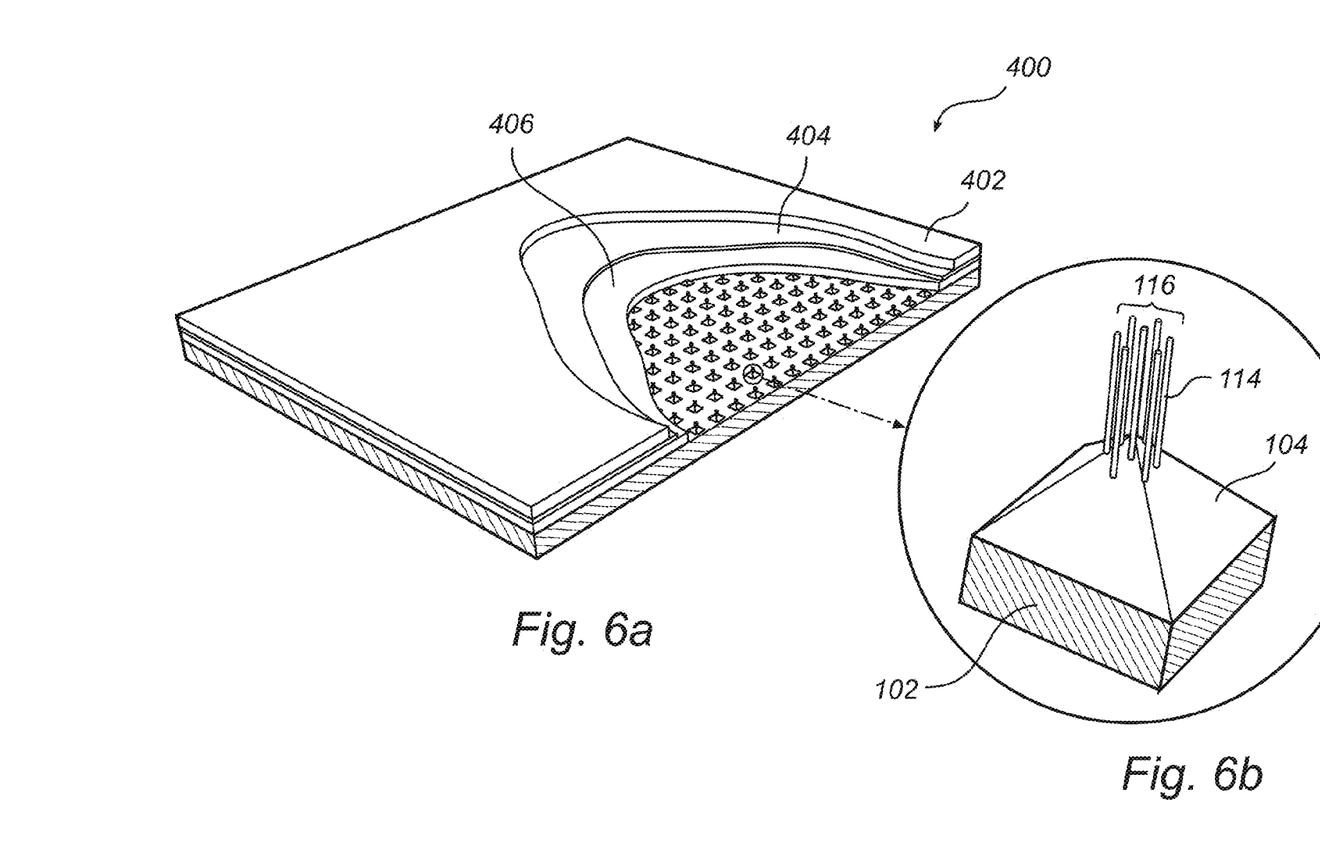
FIG. 6a schematically illustrates a device according to an embodiment of the invention.
FIG. 6b schematically illustrates a detail of a device according to an embodiment of the invention.

Finally, in FIG. 6a there is depicted a conceptual flat field emission lighting arrangement 400 comprising a field emission cathode being based on the concept shown in relation to FIG. 1f, and also illustrated in detail in FIG. 6b. It should be noted that an ideal arrangement of the cathode nanorods 114 is illustrated in FIG. 6a. A manufactured device would more likely comprise a nanorod arrangement similar to what is illustrated in FIG. 4. In essence, the flat field emission lighting arrangement 400 comprises the layered structure as is shown in FIG. 5, e.g. comprising a transparent layer, such as a glass layer 402 (materials having similar characteristics are of course possible and within the scope of the invention), a transparent anode layer, such as an ITO layer 404 and a phosphor layer 406. The field emission cathode may comprise a conductive and possibly addressable matrix base structure where there are arranged a plurality of protruding base structures 104 provided in a similar manner as in relation to FIG. 1a. The protruding base structures 104 are in turn provided with at least one nanostructure, for example comprising ZnO nanostructures or carbon nanotubes. The operation of the flat field emission lighting arrangement 400 is similar to the field emission lighting arrangement 302 of FIG. 5, however, the phosphor layer may be sectioned and comprised of different types of phosphor emitting light of different colors. Also, as mentioned, the base structures may be configured as an addressable matrix and may together with the sectioned phosphor layer 406 be used for emitting lights of different color, for example simultaneously. Accordingly, the flat field emission lighting arrangement 400 may be used as a multi color display.

The person skilled in the art realizes that the present invention by no means is limited to the preferred embodiments described above. On the contrary, many modifications and variations are possible within the scope of the appended claims. For example, other materials and material combinations may be used for the substrate, protruding base structures, seed layer mixture and growth layer mixture while still remaining within the general concept of the method according to the present invention. Additionally, it may alternatively be possible to use also the second substrate having protruding base structures identical to those on the first substrate as a base for nanostructure growth. Since some ZnO particles serving as nucleation sites may also remain on the protruding base structures of the upper substrate after evaporation of solvent in the seed layer mixture, the upper substrate could be also used for growing ZnO nanostructures, thereby doubling manufacturing throughput for the step of forming the seed layer.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

We claim:

1. A method for manufacturing a plurality of nanostructures comprising:
   providing a plurality of protruding base structures arranged on a surface of a first substrate;
   providing a seed layer mixture, comprising a solvent and a seed material, in contact with said protruding base structures;
   providing a second substrate arranged in parallel with said first substrate adjacent to said protruding base structures such that a majority of said seed layer mixture is enclosed between said first and second substrates;
   evaporating said solvent, thereby forming a seed layer comprising said seed material on said protruding base structures;
   removing said second substrate;
   providing a growth mixture, comprising a growth agent, in contact with said seed layer; and
   controlling the temperature of said growth mixture so that nanostructures are formed on said seed layer,
   wherein said second substrate comprise a plurality of protruding base structures corresponding to the protruding base structures of the first substrate.

2. Method according to claim 1, wherein the nanostructure is composed of ZnO.

3. Method according to claim 1, wherein the temperature of said growth mixture is controlled to be between 60 and 100° C., preferably between 80 and 95° C. and most preferably between 88 and 92° C.

4. Method according to claim 1, wherein said protruding base structures of said first and said second substrate are shaped as square pyramids.

5. Method according to claim 4, wherein providing a second substrate arranged in parallel with said first substrate further comprises arranging said second substrate such that the protruding base structures of the second substrate non-contactingly engage the protruding base structures of the first substrate.

6. Method according to claim 1, wherein the plurality of protruding base structures are arranged in an array having a center-to-center distance of 10 µm to 100 µm, more preferably 10 µm to 60 µm, and most preferably 10 µm to 40 µm.

7. Method according to claim 1, further comprising coating said protruding base structures with a conductive material.

8. Method according to claim 1, wherein said seed material comprises a plurality of ZnO particles having a median particle size (D50) in the range of 20 nm to 150 nm.

9. Method according to claim 1, wherein said growth mixture comprises zinc nitrate hexahydrate and at least one amine.

10. Method according to claim 1, wherein said growth mixture comprises hexamethylenetetramine and a capping agent.

11. Method according to claim 1, wherein providing a growth mixture in contact with said seed layer comprises arranging said first substrate in said growth mixture so that said seed layer faces a downward direction.

12. A cathode configured to be used in a field emission lighting arrangement, said cathode comprising:
   a substrate comprising an array of protruding base structures, each protruding base structure comprising a plurality of nanostructures arranged thereon fabricated according to the method of claim 1.

13. Cathode according to claim 12, wherein
   said protruding base structures are shaped as square pyramids.

14. Cathode according to claim 13, wherein the protruding base structures are square pyramids having a base size of 20 to 40 µm.

15. Field emission arrangement comprising:
   an anode structure at least partly covered by a phosphor layer, said anode structure being configured to receive electrons emitted by a field emission cathode according to claim 12;
   an evacuated chamber in which said anode structure and field emission cathode is arranged; and a power supply connected to the anode and the field emission cathode configured to apply a voltage so that an electron is emitted from the cathode to the anode.

\* \* \* \* \*